United States Patent
Ishii et al.

(10) Patent No.: US 9,799,700 B2
(45) Date of Patent: Oct. 24, 2017

(54) INFRARED SENSOR

(71) Applicant: KABUSHIKI KAISHA TOSHIBA, Tokyo (JP)

(72) Inventors: Koichi Ishii, Kanagawa (JP); Hideyuki Funaki, Tokyo (JP)

(73) Assignee: Kabushiki Kaisha Toshiba, Tokyo (JP)

(*) Notice: Subject to any disclaimer, the term of this patent is extended or adjusted under 35 U.S.C. 154(b) by 155 days.

(21) Appl. No.: 14/844,319

(22) Filed: Sep. 3, 2015

(65) Prior Publication Data
US 2016/0079293 A1    Mar. 17, 2016

(30) Foreign Application Priority Data

Sep. 12, 2014  (JP) ................... 2014-186534

(51) Int. Cl.
*G01J 5/20* (2006.01)
*H01L 27/146* (2006.01)

(52) U.S. Cl.
CPC .. *H01L 27/14649* (2013.01); *H01L 27/14618* (2013.01); *H01L 27/14623* (2013.01); *H01L 2224/48091* (2013.01); *H01L 2224/73265* (2013.01)

(58) Field of Classification Search
CPC ......... H01L 27/14618; H01L 27/14623; H01L 27/14649
USPC ........................... 250/338.4, 338.1
See application file for complete search history.

(56) References Cited

U.S. PATENT DOCUMENTS

| 5,397,897 | A | 3/1995 | Komatsu et al. |
| 5,962,854 | A | 10/1999 | Endo |
| 7,718,965 | B1* | 5/2010 | Syllaios ............... G01J 5/02 250/338.1 |
| 9,227,839 | B2* | 1/2016 | Gooch .............. B81B 7/0067 |
| 2010/0181484 | A1* | 7/2010 | Inada ............... G02B 5/1876 250/332 |
| 2010/0230594 | A1* | 9/2010 | Honda ............ H01L 27/14623 250/332 |
| 2013/0248714 | A1 | 9/2013 | Honda et al. |

FOREIGN PATENT DOCUMENTS

| JP | 6-213707 | 8/1994 |
| JP | 10-318829 | 12/1998 |
| JP | 3200657 | 8/2001 |

(Continued)

*Primary Examiner* — David Porta
*Assistant Examiner* — Meenakshi Sahu
(74) *Attorney, Agent, or Firm* — Finnegan, Henderson, Farabow, Garrett & Dunner, L.L.P.

(57) ABSTRACT

An infrared sensor according to an embodiment includes a housing, a detector, a lid, and a light shielding film. The detector is mounted on the bottom surface of the housing and includes a heat-sensitive pixel region and a reference pixel region. The lid seals the housing and includes a support member and a window member. The support member is bonded to the side surfaces of the housing and has an opening positioned above the heat-sensitive pixel region. The window member is bonded to a surface of the support member on a side of the detector so as to cover the opening. The light shielding film is formed on a surface of the window member on a side of the detector and arranged on an optical path of the infrared rays entering the reference pixel region.

11 Claims, 8 Drawing Sheets

(56) References Cited

FOREIGN PATENT DOCUMENTS

| JP | 3222579 | 10/2001 |
|----|---------|---------|
| JP | 2011-203194 | 10/2011 |
| JP | 2013-200187 | 10/2013 |

\* cited by examiner

INFRARED SENSOR

CROSS REFERENCE TO RELATED APPLICATION(S)

This application is based upon and claims the benefit of priority from the prior Japanese Patent Application No. 2014-186534, filed on Sep. 12, 2014, the entire contents of which are incorporated herein by reference.

FIELD

Embodiments described herein relate generally to an infrared sensor.

BACKGROUND

An infrared sensor (infrared rays image pickup device) for receiving infrared rays emitted from an object and converting it into an electrical signal can obtain a temperature distribution of the object day and night. Since the infrared rays have higher permeability relative to smoke and mist than that of visible light, the infrared sensor can take an image under a bad condition. Therefore, the infrared sensor has a wide application range such as a defense field, a security camera, a fire detecting camera, and an onboard camera for night vision.

The infrared sensors are divided into two kinds, i.e., a cooling type and a non-cooling type. The cooling type is an infrared sensor for using inter-band transition of a carrier caused by receiving the infrared rays. It is necessary for the cooling type to have a cooler. Therefore, it is difficult to miniaturize the device, and a manufacturing cost increases. Therefore, the use of the infrared sensor of the cooling type is limited to a specific field.

Whereas, the non-cooling type is a thermal infrared sensor which is a so-called bolometer. The non-cooling type has a mechanism to convert the received infrared rays into heat and convert the heat into the electrical signal. Since the non-cooling type can operate at room temperature, it is not necessary to have the cooler. Therefore, the non-cooling type device can be easily miniaturized and can keep the manufacturing cost lower. Accordingly, the non-cooling type is widely used compared with the cooling type.

Since the temperature of the non-cooling type infrared sensor changes according to the environmental temperature, the non-cooling type infrared sensor is affected by the environmental temperature. In order to remove the effect by the environmental temperature, the non-cooling type infrared sensor outputs a signal in which a signal by the reference pixel for not reacting to the infrared rays has been subtracted from a signal by the heat-sensitive pixel for reacting to the infrared rays.

It is necessary for the reference pixel not to react to the infrared rays, and in addition, it is necessary that the change of the electrical characteristics relative to the change of the environmental temperature of the reference pixel coincide with that of the heat-sensitive pixel. This is because the output of the infrared sensor is changed according to the environmental temperature when the change of the electrical characteristics relative to the change of the environmental temperature of the reference pixel does not coincide with that of the heat-sensitive pixel. However, it has been difficult to realize both non-sensibility to the infrared rays and the consistency with the electrical characteristics of the heat-sensitive pixel.

For example, as a method to realize the non-sensibility to the infrared rays, a pixel structure, that is, a thermal black pixel (TB pixel) has been proposed. The thermal black pixel instantaneously releases the heat generated by the received infrared rays to a side of a substrate while receiving infrared rays. However, there is a possibility that the electrical characteristics of the reference pixel are different from that of the heat-sensitive pixel when the TB pixel is used as the reference pixel.

As an another method, an optical black pixel (OB pixel) has been proposed. In the optical black pixel, a part of the heat-sensitive pixels is shielded by a light shielding film. When the OB pixel is used as the reference pixel, the structure of the reference pixel can be the same as that of the heat-sensitive pixel. Therefore, the electrical characteristics of the reference pixel can be coincided with that of the heat-sensitive pixel. However, it is difficult to completely shield the infrared rays. The OB pixels are influenced by incident infrared rays with high energy and cannot function as reference pixels.

DETAILED DESCRIPTION

Embodiments will now be explained with reference to the accompanying drawings. The present invention is not limited to the embodiments.

An infrared sensor according to an embodiment includes a housing, a detector, a lid, and a light shielding film. The housing has a bottom surface and side surfaces. The detector is mounted on the bottom surface of the housing and includes a heat-sensitive pixel region and a reference pixel region. The heat-sensitive pixel region has a plurality of heat-sensitive pixels of which an output voltage changes when infrared rays are received. The reference pixel region has at least one reference pixel of which output voltage changes are smaller than those of the heat-sensitive pixel while receiving the infrared rays. The lid seals the housing and includes a support member and a window member. The support member is bonded to the side surfaces of the housing and has an opening positioned above the heat-sensitive pixel region. The window member is bonded to a surface of the support member on a side of the detector so as to cover the opening. The light shielding film is formed on a surface of the window member on a side of the sensor and arranged on an optical path of the infrared rays entering the reference pixel region.

First Embodiment

Figure 1:
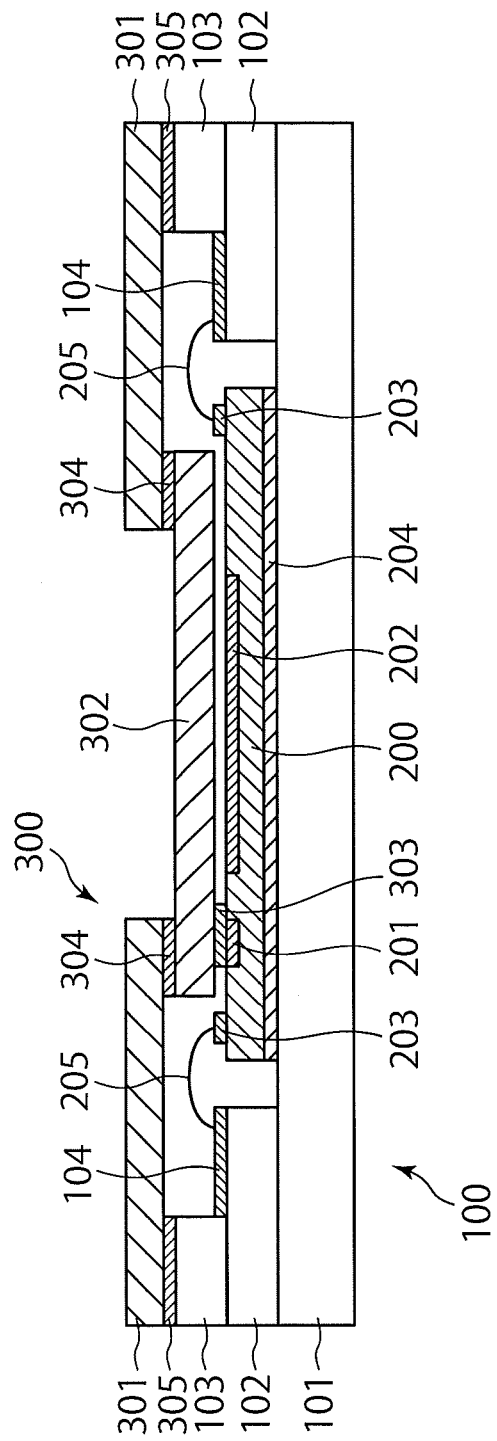
FIG. 1 is a sectional view of an exemplary structure of an infrared sensor according to a first embodiment.

An infrared sensor according to a first embodiment will be described with reference to FIGS. 1 to 6. FIG. 1 is a sectional view of an exemplary infrared sensor according to the present embodiment. As illustrated in FIG. 1, the infrared sensor includes a sensor housing 100, a detector 200, a lid 300, and a light shielding film 303.

The sensor housing 100 includes a base 101, first banks 102, and second banks 103. The base 101, the first bank 102, and the second bank 103 are formed of materials such as alumina and aluminum nitride.

The base 101 forms the bottom surface of the sensor housing 100, and the detector 200 is mounted on a surface of the base 101. A metal layer, which is not shown, is provided on the surface of the base 101 to perform die mounting to the detector 200.

The first bank 102 forms the side surfaces of the sensor housing 100 and is laminated on an outer circumferential part on the base 101. Electrodes 104 to transmit/receive a signal to/from the detector 200 are provided on the surfaces of the first banks 102.

The second bank 103 forms the side surfaces of the sensor housing 100 together with the first bank 102 and is laminated on the outer circumferential part on the first bank 102. A metal layer, which is not shown, is provided on a surface of the second bank 103 to bond the lid 300.

The detector 200 is mounted on the bottom surface of the sensor housing 100, that is, the surface of the base 101 and formed from a semiconductor. The detector 200 converts the received infrared rays into heat and outputs an electrical signal according to the heat. The detector 200 includes at least a reference pixel region 201, a heat-sensitive pixel region 202, and pads 203.

The reference pixel region 201 is a region, where a plurality of pixels is arranged, on the surface of the detector 200. The pixel is a light receiving element for outputting a signal according to the heat.

The plurality of pixels arranged on the reference pixel region 201 is used as a reference pixel of the infrared sensor. The reference pixel in the present embodiment is an OB pixel and outputs a signal according to an environmental temperature while being shielded from the infrared rays. Therefore, the reference pixel region 201 is shielded by the light shielding film 303 so as not to receive the infrared rays. The light shielding film 303 will be described below.

The heat-sensitive pixel region 202 is a region on the surface of the detector 200 where the plurality of pixels is arranged similarly to the reference pixel region 201.

The plurality of pixels arranged on the heat-sensitive pixel region 202 is used as a heat-sensitive pixel of the infrared sensor. The heat-sensitive pixel outputs a signal according to the received infrared rays. Therefore, the window member 302 which transmits the infrared rays covers the upper parts of the heat-sensitive pixel region 202 so that the heat-sensitive pixel region 202 can receive the infrared rays. The window member 302 will be described below.

The pixels having the same structures are arranged on the above-mentioned reference pixel region 201 and the heat-sensitive pixel region 202. Therefore, the electrical characteristics of the reference pixel and the heat-sensitive pixel of the infrared sensor coincide with each other without depending on incident infrared rays.

Figure 2:
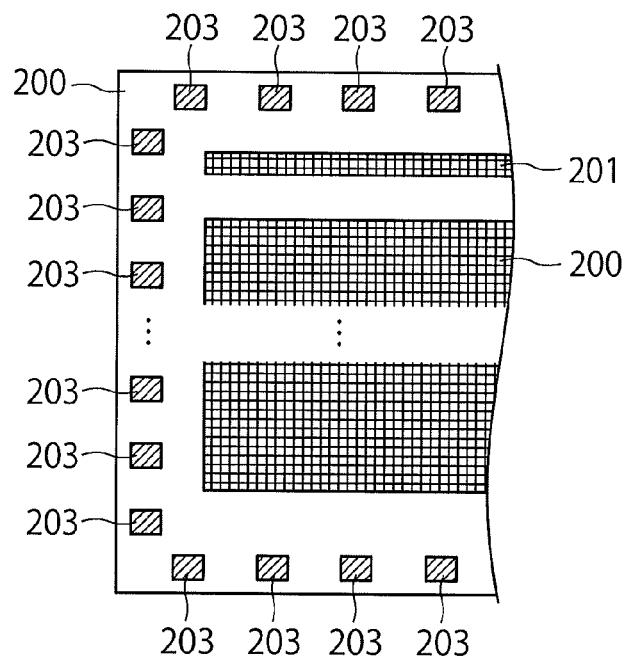
FIG. 2 is a plan view of an exemplary detector of the infrared sensor in FIG. 1.

Here, FIG. 2 is a plan view of an exemplary detector 200. In the detector 200 in FIG. 2, the pixels of $n_1$ rows and m columns are arranged on the reference pixel region 201, and the pixels of $n_2$ rows and m columns are arranged on the heat-sensitive pixel region 202. In FIG. 2, an array in the horizontal direction is a row, and an array in the vertical direction is a column.

As illustrated in FIG. 2, the plurality of pads 203 is provided in the outer circumferential part on the surface of the detector 200. The pad 203 is an electrode to make the detector 200 transmit/receive signals to/from outside. The pad 203 is connected to the electrode 104 on the first bank 102 with a bonding wire 205. Accordingly, the signals output from the pixels arranged on the reference pixel region 201 and the heat-sensitive pixel region 202 can be transmitted/received to/from outside.

A metal layer, which is not shown, is provided on the bottom surface of the detector 200 to perform the die mounting to the detector 200. The detector 200 is fixed to the surface of the base 101 with a die attach material 204 via the metal layer. The die attach material 204 is, for example, a metal material such as AuSn.

The lid 300 is bonded to the sensor housing 100 so as to cover the upper side of the detector 200. The inside of the sensor housing 100, that is, a space in the sensor housing 100 having the detector 200 mounted therein is vacuum sealed with the lid 300. An atmospheric pressure in the sensor housing 100 is, for example, equal to or less than 1 Pa. In this way, the inside of the sensor housing 100 is vacuum sealed so that the detector 200 can be vacuum insulated. Therefore, a sensitivity of the heat-sensitive pixel can be improved at a maximum. As illustrated in FIG. 1, the lid 300 includes a support member 301 and a window member 302.

The support member 301 is bonded to the side surfaces of the sensor housing 100, that is, the surface of the second bank 103 with a bonding material 305. The support member 301 is formed from a material such as metal and glass which does not transmit the infrared rays. The support member 301 has a function to support the window member 302, and in addition, has a role to prevent the entrance of unnecessary infrared rays. This is because the entered unnecessary infrared rays become stray light which repeats complex reflection in the infrared sensor and cause a negative effect on the image when reaching the detector 200.

Figure 3:
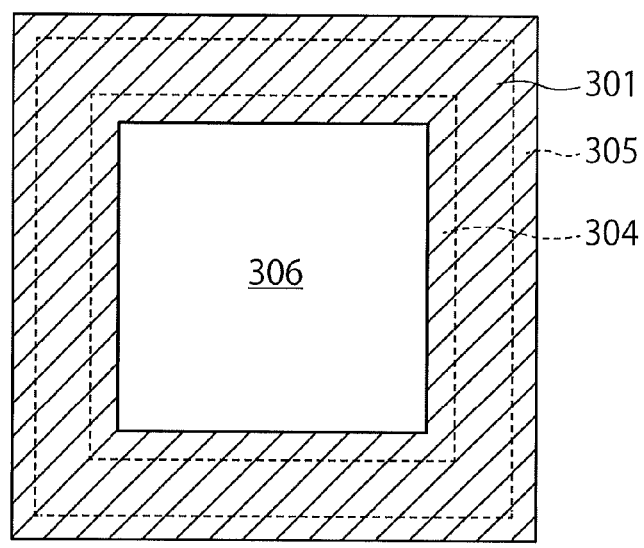
FIG. 3 is a plan view of an exemplary support member of the infrared sensor in FIG. 1.

Here, FIG. 3 is a plan view of an exemplary support member 301. As illustrated in FIG. 3, the support member 301 is formed in a rectangular shape. The support member 301 has a bonding region in the outer circumferential part bonded to the surface of the second bank 103 with the bonding material 305 and has the rectangular-shaped opening 306 therein.

The opening 306 is formed to be positioned above the heat-sensitive pixel region 202 of the detector 200 when the lid 300 is bonded to the sensor housing 100. Therefore, when the infrared sensor is viewed from the above (side of the lid 300), at least a part of the heat-sensitive pixel region 202 is positioned in the opening 306. The infrared rays emitted from outside are received by the heat-sensitive pixel region 202 through the opening 306.

It is preferable that the opening 306 be formed larger than the heat-sensitive pixel region 202 so that the whole heat-sensitive pixel region 202 can receive the infrared rays. That is, it is preferable that the opening 306 be formed so that the whole heat-sensitive pixel region 202 is positioned in the opening 306 when the infrared sensor is viewed from the above.

The window member 302 is bonded on the surface of the support member 301 on a side of the detector 200 with the bonding material 304 so as to cover the opening 306. Accordingly, the lid 300 has a laminated structure of the support member 301 and the window member 302. The window member 302 is arranged closer to the detector 200 than the support member 301.

The window member 302 is formed from a material such as silicon, germanium, and zinc sulfide which transmits the infrared rays. An antireflection film may be formed on a region other than the light shielding film 303 and the bonding material 304 on the both sides of the window member 302. The infrared rays entered from the opening 306 pass through the window member 302 and are received by the heat-sensitive pixel region 201.

The window member 302 is formed so as not to cover the upper part of the pad 203 provided on the outer circumferential part of the detector 200. Accordingly, a space to form the bonding wire 205 is secured above the pad 203 and the electrode 104. The height of the space is substantially similar to that of the second bank 103.

Figure 4:
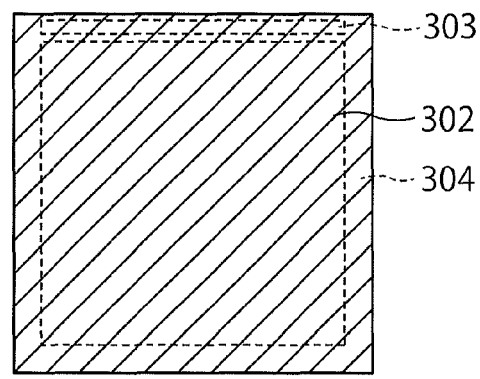
FIG. 4 is a plan view of an exemplary window member of the infrared sensor in FIG. 1.

Here, FIG. 4 is a plan view of an exemplary window member 302. As illustrated in FIG. 4, the window member 302 has a rectangular shape and has a bonding region in the outer circumferential part bonded to the bottom surface of the support member 301 with the bonding material 304.

In this way, the lid 300 has the laminated structure of the support member 301 and the window member 302, and the support member 301 is bonded to the sensor housing 100. Accordingly, the stress applied to the window member 302 can be reduced. Accordingly, the thickness of the window member 302 can be reduced.

By reducing the thickness of the window member 302, the mass of the window member 302 is reduced, and the material cost of the window member 302 can be reduced. Generally, a material which transmits the infrared rays and forms the window member 302 is expensive. Therefore, the cost of the infrared sensor can be reduced by reducing the material cost of the window member 302. Also, by reducing the thickness of the window member 302, it is possible to thin the infrared sensor and improve the sensitivity of the infrared sensor according to the improvement of the transmittance of the infrared rays.

The light shielding film 303 is formed on the surface of the window member 302 on a side of the detector 200. The light shielding film 303 is formed from a material such as metal and glass which does not transmit the infrared rays. The light shielding film 303 is arranged on the optical path of the infrared rays for entering the reference pixel region 201 so that the infrared rays do not enter the reference pixel region 201 of the detector 200. Here, the arrangement of the light shielding film 303 will be described in detail with reference to FIG. 5.

Figure 5:
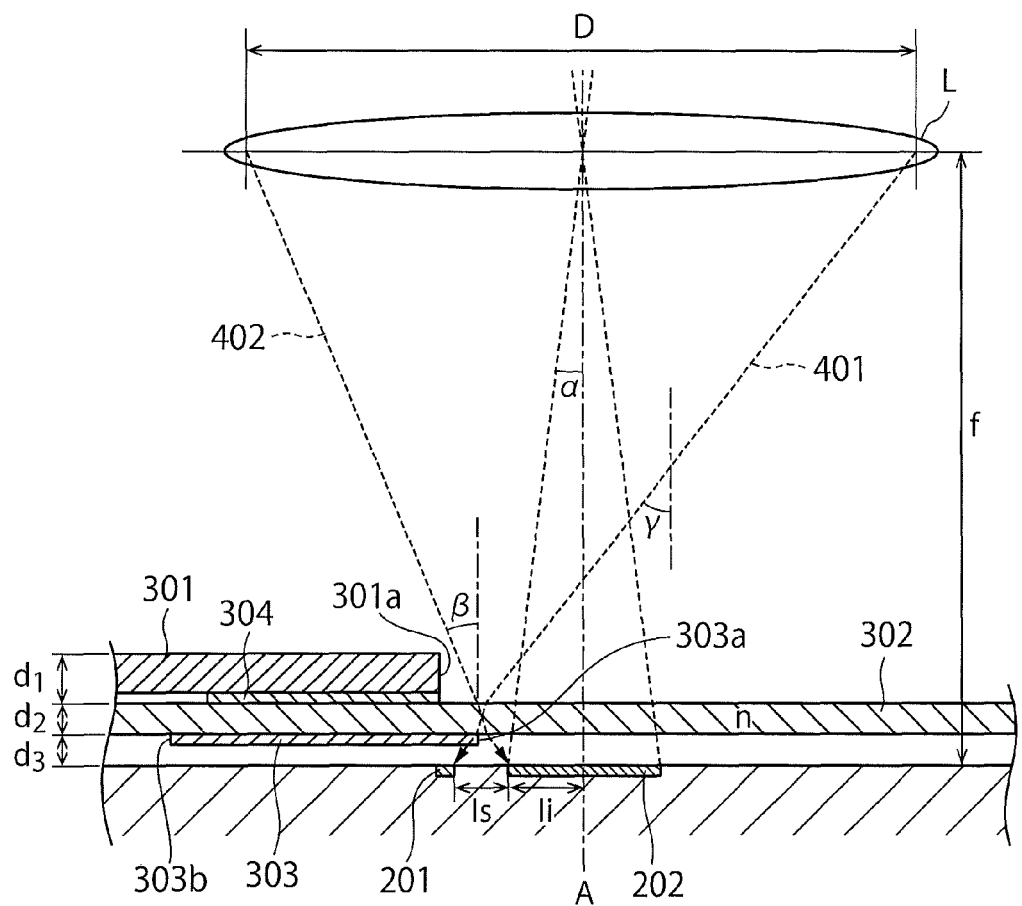
FIG. 5 is a partial enlarged view of FIG. 1.

FIG. 5 is a partial enlarged view in which a region around the light shielding film 303 in FIG. 1 is enlarged. A lens L for collecting the infrared rays is illustrated in FIG. 5. The lens L is arranged so that an optical axis A is aligned with the center of the heat-sensitive pixel region 202.

Also, a broken line indicates an optical path of the infrared rays for entering the surface of the detector 200. An optical path 401 is an optical path of the infrared rays which enter an end of the reference pixel region 201 on a side of the heat-sensitive pixel region 202 and have an incidence angle $\gamma$. The incidence angle $\gamma$ is the maximum value of the incidence angle of the infrared rays for entering the end of the reference pixel region 201 on a side of the heat-sensitive pixel region 202. A positional relation between the optical path 401 and the infrared sensor is expressed by the following formulas (1) and (2).

[expression 1]

$$\{f - (d_2 + d_3)\}\tan\gamma - \frac{D}{2} + d_2\frac{\sin\gamma}{\sqrt{n^2 - \sin^2\gamma}} + d_3\tan\gamma = l_i + l_s \quad (1)$$

$$D = \frac{l_i}{F\tan\alpha} \quad (2)$$

In the formula (1), the letter "f" indicates a distance from the lens L to the detector 200 (focal length), and the letter "D" indicates an effective diameter of the lens L. The letter "n" indicates a refractive index of the window member 302, and $d_1$ (>0) indicates a distance from the surface of the support member 301 to the surface of the window member 302. $d_2$ (>0) indicates a thickness of the window member 302, and $d_3$ (≥0) indicates a distance from a rear surface of the window member 302 to the surface of the detector 200. The letter "$l_s$" indicates a distance between the reference pixel region 201 and the heat-sensitive pixel region 202, and the letter "$l_i$" indicates a distance from the optical axis A to the end of the heat-sensitive pixel region 202. In the formula (2), F is an F number of the lens L and a is a half viewing angle.

Also, an optical path 402 is an optical path of the infrared rays which enter an end of the heat-sensitive pixel region 202 on a side of the reference pixel region 201 and have an incidence angle $\beta$. The incidence angle $\beta$ is the maximum value of the incidence angle of the infrared rays for entering the end of the heat-sensitive pixel region 202 on a side of the reference pixel region 201. A positional relation between the optical path 402 and the infrared sensor is expressed by the following formula (3).

[expression 2]

$$\frac{D}{2} - \left[\{f - (d_2 + d_3)\}\tan\beta + d_2\frac{\sin\beta}{\sqrt{n^2 - \sin^2\beta}} + d_3\tan\beta\right] = l_i \quad (3)$$

In the description below, the side of the heat-sensitive pixel region 202 viewed from the reference pixel region 201 in FIG. 5 is referred to as a "right side", and the side of the reference pixel region 201 viewed from the heat-sensitive pixel region 202 is referred to as a "left side".

First, a position of an end 303a on the right side (on a side of the heat-sensitive pixel region 202) of the light shielding film 303 will be described. As illustrated in FIG. 5, the light shielding film 303 is arranged so that the end 303a is positioned on the right side of the right end of the reference pixel region 201. More specifically, the light shielding film 303 is arranged so that the end 303a is positioned on the right side of the optical path 401. That is, the end 303a is positioned on the right side of an optical path of optional infrared rays for entering the end of the reference pixel region 201 on the right side.

Also, it is preferable that the light shielding film 303 is arranged so that the end 303a is positioned on the left side of the optical path 402. As described above, when it is assumed that a distance between the end 303a and the optical axis A is Y, the light shielding film 303 is arranged so that the position of the end 303a satisfies the following formula (4).

[expression 3]

$$l_i + d_2 \frac{\sin \beta}{\sqrt{n^2 - \sin^2 \beta}} + d_3 \tan \beta \le Y \le \quad (4)$$

$$\{f - (d_2 + d_3)\tan \gamma - \frac{D}{2} + d_2 \frac{\sin \gamma}{\sqrt{n^2 - \sin^2 \gamma}}\}$$

In addition, it is preferable that the light shielding film 303 be arranged so that an end 303b on the left side (opposite to the heat-sensitive pixel region 202) is positioned on the left side of the left end of the reference pixel region 201.

By arranging the light shielding film 303 in this way, the entrance of the infrared rays emitted from outside and the infrared rays reflected in the sensor housing 100 to the reference pixel region 201 can be prevented, and a light shielding property of the reference pixel can be improved. Also, since the infrared rays for entering the heat-sensitive pixel region 202 are not shielded by the light shielding film 303, the reduction in the sensor sensitivity caused by the light shielding film 303 can be prevented.

Also, the support member 301 is arranged so that an end 301a on the right side is positioned on the left side of the end 303a of the light shielding film 303. Specifically, it is preferable that the support member 301 be arranged at a position which does not interrupt the optical path 402. Here, when it is assumed that a distance between the end 301a and the optical axis A is M, the support member 301 is preferably arranged so that the position of the end 301a satisfies the following formula (5).

[expression 4]

$$M \ge l_i + d_1 \tan \beta + d_2 \frac{\sin \beta}{\sqrt{n^2 - \sin^2 \beta}} + d_3 \tan \beta \quad (5)$$

By arranging the support member 301 in this way, the infrared rays for entering the heat-sensitive pixel region 202 are not shielded by the support member 301. Therefore, the reduction in the sensor sensitivity caused by the support member 301 can be prevented.

The lid 300 may include a getter material layer on the surface on a side of the detector 200 in order to keep a vacuum environment in the sensor housing 100.

Figure 8:
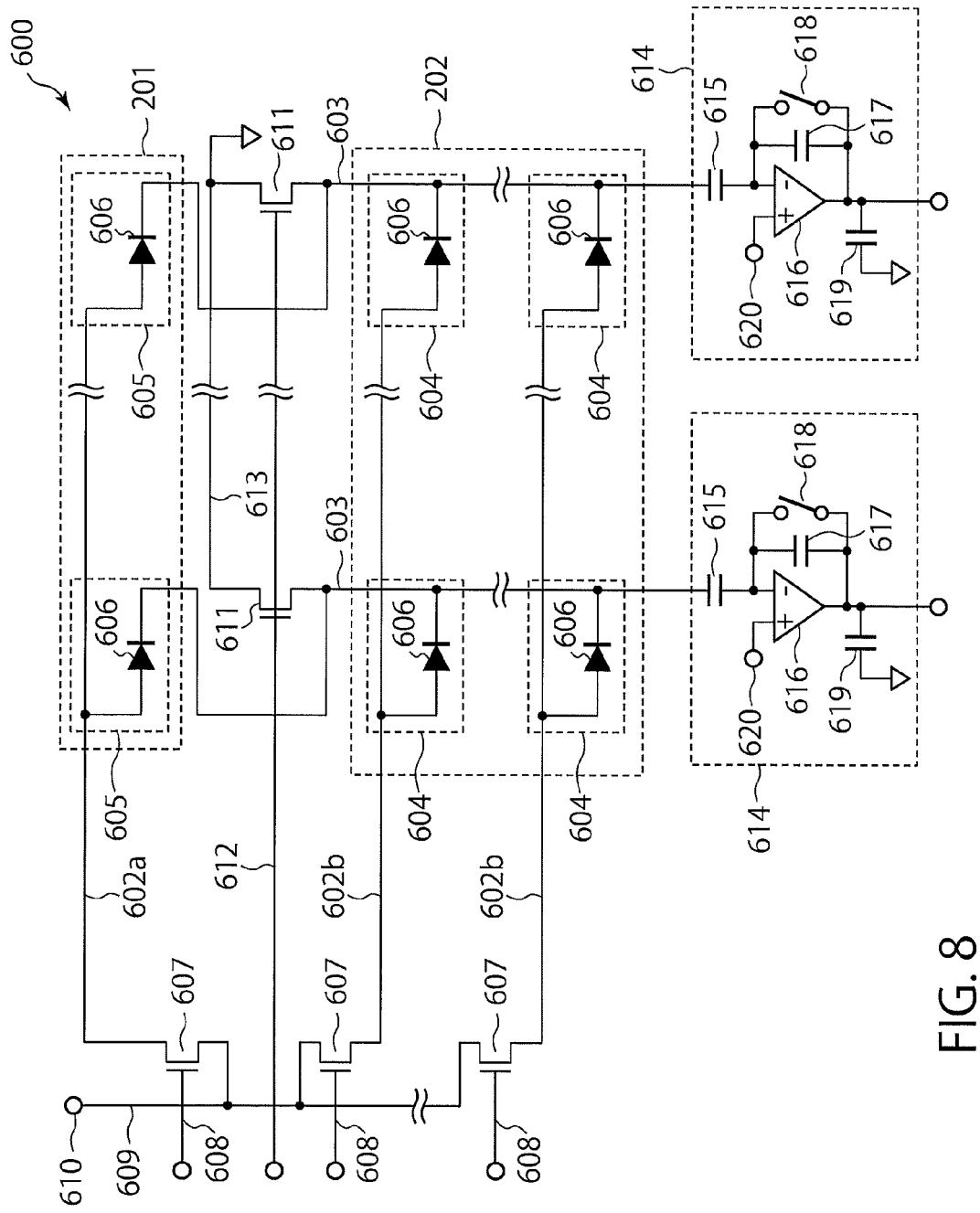
FIG. 8 is a circuit diagram of a circuit of the detector of the infrared sensor in FIG. 1.

Next, a circuit of the detector in the present embodiment will be described with reference to FIG. 8. FIG. 8 is a circuit diagram to drive the infrared sensor according to the present embodiment. As illustrated in FIG. 8, the reference pixel region 201 and the heat-sensitive pixel region 202 are set in a detector 600.

The reference pixel region 201 includes a plurality of reference pixels 605, and each reference pixel 605 includes a pn junction diode 606 as a thermoelectric conversion device therein. The heat-sensitive pixel region 202 includes a plurality of heat-sensitive pixels 604, and each heat-sensitive pixel 604 includes the pn junction diode 606 as the thermoelectric conversion device therein. The reference pixel 605 has the same structure as that of the heat-sensitive pixel 604. For example, a pixel structure disclosed in JP 2011-188140 A can be applied to them.

Here, as illustrated in FIG. 1, the entrance of the infrared rays from outside to the reference pixel 605 of the reference pixel region 201 is blocked by the light shielding film 303 of the window member 302. Accordingly, an output is not changed according to the infrared rays from outside. On the other hand, the infrared rays from outside enter the heat-sensitive pixel 604 of the heat-sensitive pixel region 202. Therefore, the output is changed according to the infrared rays from outside.

In the heat-sensitive pixel region 202, a plurality of horizontal signal lines 602b which extends in a row direction and a plurality of vertical signal lines 603 which extends in a column direction intersecting with (for example, orthogonal to) the row direction are provided. Each heat-sensitive pixel 604 is arranged in an intersection part between each horizontal signal line 602b and each vertical signal line 603. An anode side of each pn junction diode 606 is connected to the corresponding horizontal signal line 602b, and a cathode side of each pn junction diode 606 is connected to the corresponding vertical signal line 603.

A row selector 607 corresponding to each horizontal signal line 602b is provided outside the heat-sensitive pixel region 202. A row selecting signal 608 for turning on the row selector 607 is input to the row selector 607, and the horizontal signal line 602b corresponding to the row selector 607 which has been turned on is selected. A voltage of a drive voltage terminal 610 is applied to the selected horizontal signal line 602b via a drive signal line 609.

On one side in the column direction viewed from the heat-sensitive pixel region 202 (upper side in FIG. 8), load transistors 611 are provided. The number of the load transistors 611 is the same as that of the vertical signal lines 603. Each load transistor 611 is corresponded and connected to each vertical signal line 603 one to one. Also, on the same side as the load transistor 611 viewed from the heat-sensitive pixel region 202, a single power supply line 612 for extending in the row direction and a ground line 613 for extending in the row direction are provided.

The reference pixel region 201 is provided on the opposite side of the heat-sensitive pixel region 202 in the column direction viewed from the load transistor 611. A row wholly including the reference pixels 605 is formed in the reference pixel region 201 (referred to as a "reference row" below). Similarly to the heat-sensitive pixel 604, an anode side of the pn junction diode 606 is connected to the corresponding horizontal signal line 602a, and a cathode side is connected to the corresponding vertical signal line 603.

The number of the reference rows may be one as illustrated in FIG. 8 and may be plural. In this way, the reference pixel region 201 is provided in a position apart from the heat-sensitive pixel region 202, and the load transistor 611 is provided between them. That is, the load transistor 611 is arranged in a region of a distance $I_s$ in FIG. 5.

On the other hand, on the other side in the column direction viewed from the heat-sensitive pixel region 202 (lower side in FIG. 8), double correlated sampling circuits 614 are provided. The number of the double correlated sampling circuits 614 is the same as that of the vertical signal lines 603. The double correlated sampling circuit 614 includes a coupling capacity 615, a difference amplifier 616, a feedback capacity 617, a clamp switch 618, and an integral capacity 619.

A voltage of each vertical signal line 603 is input to an inverting input terminal of the difference amplifier 616 via the coupling capacity 615, and a fixed voltage $V_{CL}$ is input to a non-inverting input terminal 620. The feedback capacity 617 and the clamp switch 618 are connected in parallel between the inverting input terminal and an output terminal of the difference amplifier 616. The output terminal of the difference amplifier 616 is connected to the integral capacity 619, and another side of the integral capacity 619 is grounded.

Next, an operation of the detector 600 illustrated in FIG. 8 will be described. First, a driving voltage $V_{dd}$ is applied to the drive voltage terminal 610. Subsequently, the row selecting signal turns on the row selector 607 corresponding to the reference row, and the driving voltage $V_{dd}$ is applied to the horizontal signal line 602a corresponding to the reference row. That is, the driving voltage $V_{dd}$ is applied to the anode sides of the pn junction diodes 606 in all the reference pixels 605 included in the reference row.

On the other hand, the load transistor 611 connected to the cathode side of the pn junction diode 606 in the reference pixel 605 is used as a constant current source. A predetermined gate voltage $V_g$ is applied to a gate electrode of the load transistor 611 via the power supply line 612. A drain current $I_f$ flows in the vertical signal line 603, and the drain current $I_f$ is determined according to the gate voltage $V_g$. The drain current $I_f$ is supplied to the pn junction diode 606 in the reference pixel 605. When it is assumed that a voltage drop of the pn junction diode 606 is $V_{f0}$, the voltage of the vertical signal line 603 is $V_{dd}-V_{f0}$. The voltage is the voltage of one electrode of the coupling capacity 615.

On the other hand, the clamp switch 618 is turned on at the same time that the reference row is selected in the double correlated sampling circuit 614, and the double correlated sampling circuit 614 becomes a voltage follower circuit. That is, the inverting input terminal, the non-inverting input terminal 620, and the output terminal of the difference amplifier 616 have the voltage $V_{CL}$ which is the same as that of the non-inverting input terminal 620. Therefore, a voltage difference of $V_{CL}-(V_{dd}-V_{f0})$ is generated between both sides of the coupling capacity 615.

After that, the clamp switch 618 is turned off, and the voltage difference is held by the coupling capacity 615. When the row selector 607 which has selected the horizontal signal line 602 is turned off, the drive of the reference pixel 605 is terminated. Then, the vertical signal line 603 returns to almost zero voltage. Accordingly, the voltage of the inverting input terminal of the difference amplifier 616 is $V_{CL}-(V_{dd}-V_{f0})$, and the voltage of the vertical signal line 603 when the reference pixel 605 is driven is clamped to the voltage of the non-inverting input terminal 620. The above process is referred to as a clamp step A.

Subsequently, the row to be selected is shifted to the next row. All of the next row and rows after that include the heat-sensitive pixels 604 (referred to as a "heat-sensitive row" below).

When the row selector 607 corresponding to a first heat-sensitive row is turned on, the driving voltage $V_{dd}$ of the drive voltage terminal 610 is applied to the horizontal signal line 602 connected to the row selector 607, and all the heat-sensitive pixels 604 connected to the first heat-sensitive row are driven. The driving method is similar to that of the reference row.

That is, the drain current $I_f$ is supplied to the pn junction diode 606 by the load transistor 611, and a voltage drop $V_{f1}$ according to the drain current $I_f$ is generated in the pn junction diode 606. When it is assumed that the voltage drop of the pn junction diode 606 is $V_{f1}$, the voltage of the vertical signal line 603 is $V_{dd}-V_{f1}$.

As a result, the voltage of the inverting input terminal of the difference amplifier 616 becomes $V_{CL}+V_{f0}-V_{f1}$. A difference $V_{f0}-V_{f1}$ between the voltage $V_{CL}+V_{f0}-V_{f1}$ of the inverting input terminal and the voltage $V_{CL}$ of the non-inverting input terminal 620 is amplified and output from the output terminal of the difference amplifier 616. That is, a difference between a forward voltage $V_{f0}$ of the pn junction diode 606 in the reference pixel 605 and a forward voltage $V_{f1}$ of the pn junction diode 606 in the heat-sensitive pixel 604 is amplified.

Under a certain drain current $I_f$, the forward voltage $V_f$ of the pn junction diode 606 changes according to the temperature. The temperature of the heat-sensitive pixel 604 is determined according to three elements, i.e., the temperature of the detector 600 itself, the Joule heat caused by the drain current $I_f$, and heat generation caused by absorbing the infrared rays emitted from outside. Whereas, the temperature of the reference pixel 605 is determined according to two elements, i.e., the temperature of the detector 600 itself and the Joule heat caused by the drain current $I_f$. Therefore, the difference amplifier 616 amplifies a contributed amount of the heat generation caused by absorbing the infrared rays, which is a difference between the above two temperatures, and outputs it.

The above process is referred to as an imaging step. The completely same operation is repeated relative to the following heat-sensitive rows, and infrared information can be finally obtained from all the pixels. The operation in a single frame has been described above. In the next frame, sequentially, the reference row is driven and clamped and the heat-sensitive row is driven again.

Next, an action of the infrared sensor according to the present embodiment will be described.

First, the infrared rays emitted from outside are collected by the lens (not shown) and enter the infrared sensor. Then, the infrared rays are received by the heat-sensitive pixels arranged on the heat-sensitive pixel region 202. The heat-sensitive pixel which has received the infrared rays converts the received infrared rays into heat and outputs a signal according to the heat. In the signal, components according to the environmental temperature are superimposed.

On the other hand, since the reference pixel arranged on the reference pixel region 201 is shielded from the infrared rays by the light shielding film 303, the reference pixel outputs a signal according to the environmental temperature.

A difference between the signal from the heat-sensitive pixel and the signal from the reference pixel is output to the outside via the bonding wire 205, and it becomes an output signal of the infrared sensor.

As described above, in the infrared sensor according to the present embodiment, the electrical characteristics of the reference pixel coincides with that of the heat-sensitive pixel, and at the same time, the reference pixel which is an OB pixel can be shielded. Therefore, the infrared rays can be accurately detected regardless of the change of the environmental temperature. Also, the lid 300 has the laminated structure of the support member 301 and the window member 302. Accordingly, the infrared sensor can be miniaturized, and the material cost can be reduced. The reason will be described below.

Figure 6:
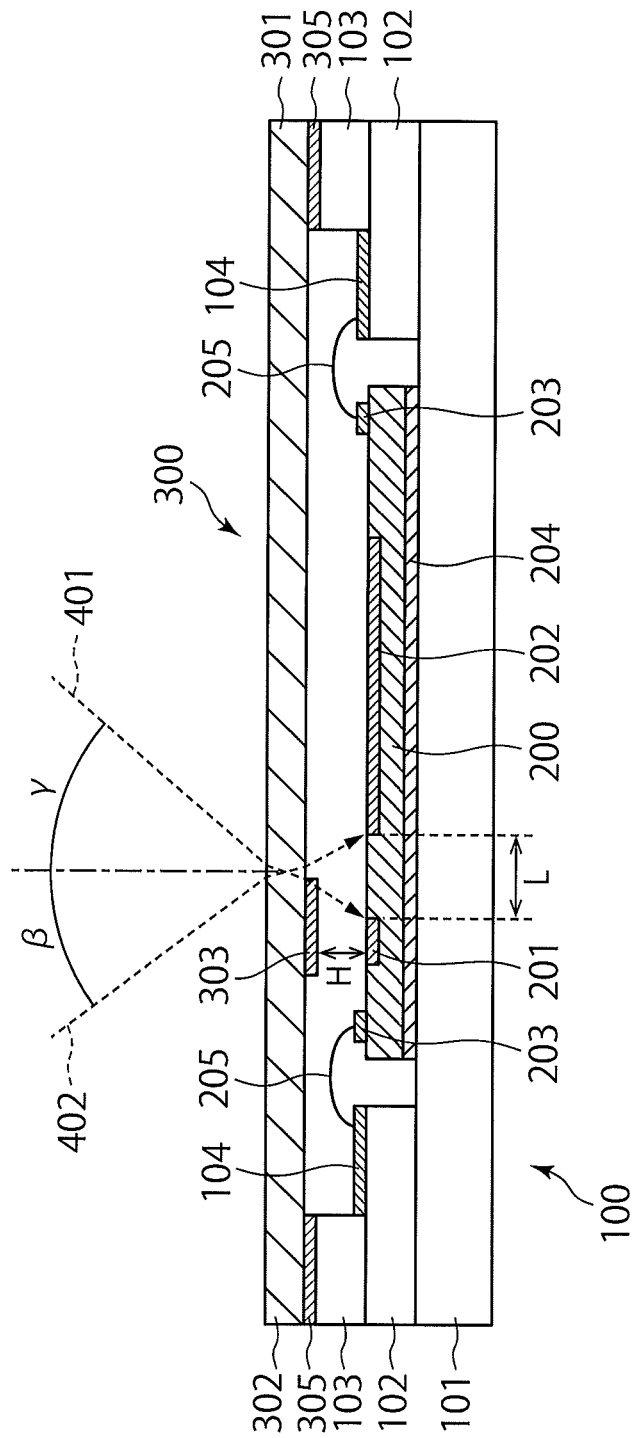
FIG. 6 is a sectional view of an exemplary structure of a traditional infrared sensor.

FIG. 6 is a sectional view of an example of a traditional infrared sensor. In the infrared sensor in FIG. 6, the lid 300 is formed by the window member 302. In the infrared sensor, when the light shielding film 303 has been formed on the surface of the window member 302 on a side of the detector 200, a distance between the light shielding film 303 and the reference pixel region 201 is a predetermined distance H.

The distance H is substantially equal to a difference between the height of the side surfaces of the sensor housing 100 and the height of the detector 200.

When the light shielding film 303 is arranged as in the present embodiment, it is necessary to have a longer distance L between the reference pixel region 201 and the heat-sensitive pixel region 202 as the distance H becomes longer. However, the longer distance L increases the area and the material cost of the detector 200. Therefore, the shorter distance L is preferable. That is, the smaller distance H is preferable.

The distance H can be reduced by lowering the height of the side surfaces of the sensor housing 100 and heightening the height of the detector 200. However, since the lid 300 of the infrared sensor in FIG. 6 has a single layer structure, a distance between the pad 203 and the lid 300 (window member 302) becomes shorter when the distance H is reduced. Since it is necessary to secure a space to form the bonding wire 205 between the pad 203 and the lid 300, the distance H of the infrared sensor in FIG. 6 is limited by the height of the space.

Whereas, the lid 300 of the infrared sensor according to the present embodiment has a laminated structure of the support member 301 and the window member 302. Therefore, the distance H between the light shielding film 303 and the reference pixel region 201 can be reduced regardless of the height of the space to form the bonding wire 205 therein. Accordingly, according to the present embodiment, the distance between the reference pixel region 201 and the heat-sensitive pixel region 202 can be reduced, and the area and the material cost of the detector 200 can be reduced. Therefore, the infrared sensor can be miniaturized, and the material cost of the infrared sensor can be reduced.

Also, in the present embodiment, the reference pixel region 201 is provided apart from the heat-sensitive pixel region 202, and the load transistor 611 which is a component of the detector 600 is positioned between the heat-sensitive pixel region 202 and the reference pixel region 201. With this arrangement, the reference pixel region 201 can be appropriately secured without increasing the area of the detector 600.

The infrared sensor according to the present embodiment may include a lens for collecting the infrared rays emitted from outside. Also, the infrared sensor may include a circuit for performing predetermined signal processing relative to the signals output from the reference pixel and the heat-sensitive pixel. In addition, the infrared sensor may be used as an infrared image pickup device of an infrared camera.

Second Embodiment

Figure 7:
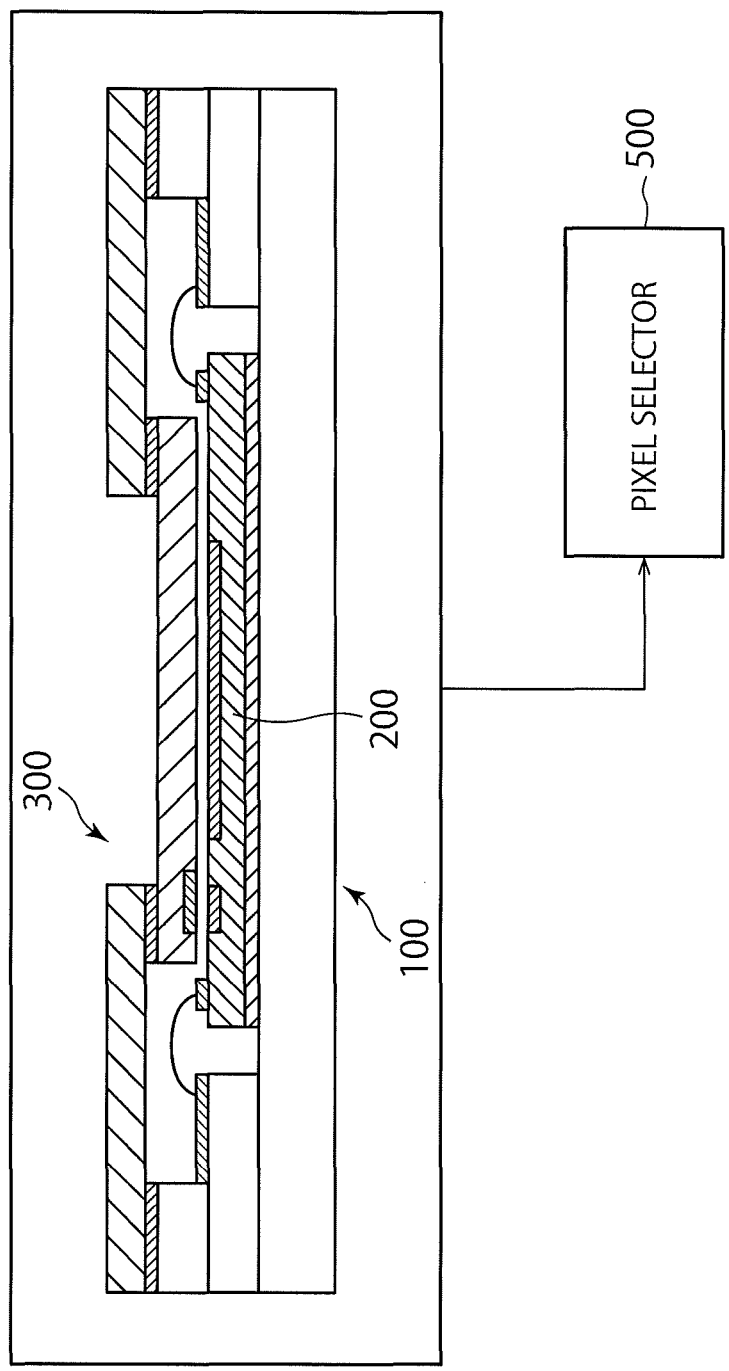
FIG. 7 is a diagram of an exemplary structure of an infrared sensor according to a second embodiment.

An infrared sensor according to a second embodiment will be described with reference to FIG. 7. The infrared sensor according to the present embodiment selects a pixel to be actually used from among the pixels provided in the infrared sensor according to the first embodiment. Here, FIG. 7 is a diagram of an exemplary infrared sensor according to the present embodiment. As illustrated in FIG. 7, the infrared sensor further includes a pixel selector 500. Other components are similar to those of the first embodiment.

The pixel selector 500 selects the pixel to be actually used from among the pixels provided in a detector 200 based on a signal from each pixel.

The pixel selector 500 obtains the signal output by the pixel arranged on a reference pixel region 201 and selects the pixel to be used as a reference pixel based on the obtained signal. The pixel selector 500 may select the reference pixel, for example, by comparing the signal from each pixel and a predetermined threshold. Also, the pixel selector 500 may select the reference pixel by performing statistical processing to the signals from the plurality of pixels arranged on the reference pixel region 201. In the present embodiment, the pixels which have not been selected by the pixel selector 500 as the reference pixel are not used.

Also, the pixel selector 500 obtains the signal output by the pixel arranged on a heat-sensitive pixel region 202 and selects the pixel to be used as a heat-sensitive pixel based on the obtained signal. The pixel selector 500 may select the heat-sensitive pixel, for example, by comparing the signal from each pixel and a predetermined threshold. Also, the pixel selector 500 may select the heat-sensitive pixel by performing statistical processing to the signals from the plurality of pixels arranged on the heat-sensitive pixel region 202. In the present embodiment, the pixels which have not been selected by the pixel selector 500 as the heat-sensitive pixel are not used.

The pixel selector 500 can include a computer device connected to the infrared sensor. The computer device includes an external storage device 106 which stores a program to realize a function of the pixel selector 500, a CPU which executes the program, and a main storage device such as a RAM for developing the program. The computer device may include a display for outputting an execution result of the program and an input device such as a keyboard.

According to the present embodiment, the pixel selector 500 selects the pixel to be used as the reference pixel or the heat-sensitive pixel after the infrared sensor has been manufactured. Accordingly, the function of the reference pixel or the heat-sensitive pixel can be secured even when the positions of the light shielding film 303 and the support member 301 are different from the design. Accordingly, the yield rate of the infrared sensor manufacturing can be substantially improved, and eventually, the manufacturing cost of the infrared sensor can be reduced.

Third Embodiment

Figure 9:
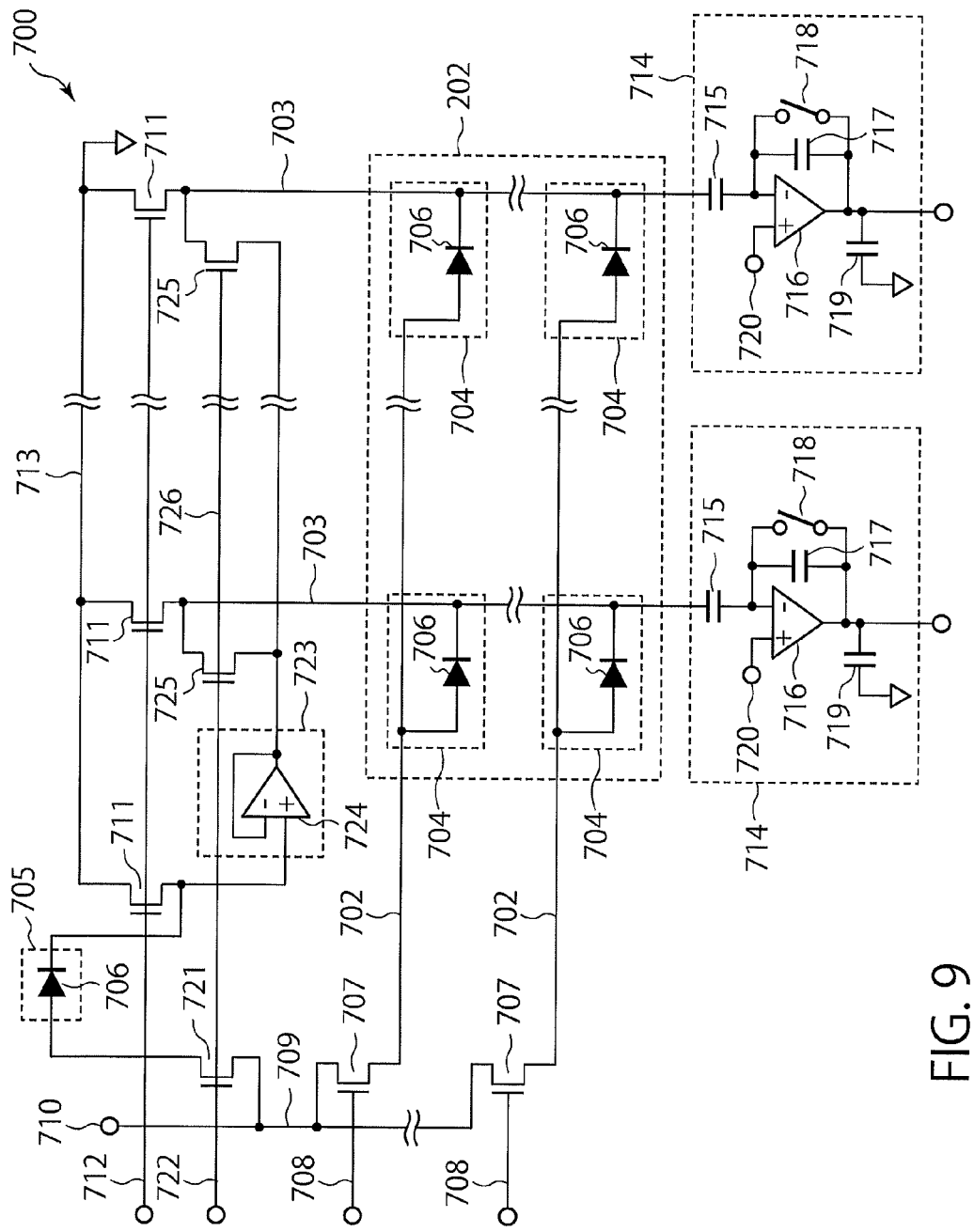
FIG. 9 is a circuit diagram of a circuit of a detector of an infrared sensor according to a third embodiment.

An infrared sensor according to a third embodiment will be described with reference to FIGS. 9 and 10. The infrared sensor according to the present embodiment includes a circuit in which a detector 700 includes a single reference pixel. Other components are similar to those of the first embodiment.

The detector 700 according to the present embodiment will be described below with reference to FIG. 9. FIG. 9 is a circuit diagram of the detector 700. The basic structure of a circuit of the detector 700 is similar to that of the detector 600 in FIG. 8. However, there is a difference between the detector 600 and the detector 700. The detector 600 includes the reference row having the reference pixels 605 of the number of rows. On the other hand, the detector 700 includes a single reference pixel 705. The reference pixel 705 is provided apart from the heat-sensitive pixel region 202 similarly to FIG. 8. For example, the reference pixel 705 is provided at the upper-left corner of the detector 700 as illustrated in FIG. 9.

A clamp controller 721 is provided on an anode side of a pn junction diode 706 in the reference pixel 705. A clamp signal is input to the clamp controller 721 via a clamp controlling signal line 722 (reference pixel selecting line). A drain electrode of a transistor included in the clamp controller 721 is connected to a drive signal line 709.

A cathode side of the pn junction diode 706 is connected to a load transistor 711 (first load transistor) used as a constant current source. A buffer 723 is further provided on the cathode side of the pn junction diode 706.

The buffer 723 is a voltage follower circuit and includes a difference amplifier 724 of which an inverting input terminal is connected to an output terminal. The cathode side of the pn junction diode 706 is connected to a non-inverting input terminal of the difference amplifier 724. The buffer 723 is connected to each vertical signal line 703 via a clamp switch 725 (reference pixel selector) for each row.

The clamp switch 725 includes a transistor. A gate electrode of the transistor included in each clamp switch 725 is connected to the gate electrode of the transistor included in the clamp controller 721 via a gate line 726. Since the circuit structure of the detector 700 other than the above is similar to that of the detector 600, the description will be omitted.

Figure 10:
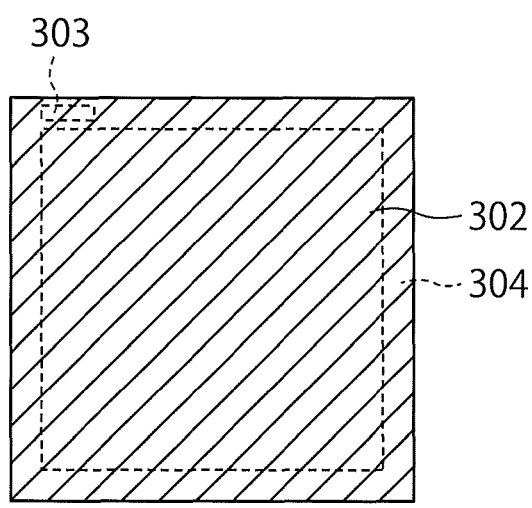
FIG. 10 is a plan view of an exemplary window member of the infrared sensor in FIG. 9.

FIG. 10 is a plan view of a window member 302 according to the third embodiment. A light shielding film 303 is provided in a region corresponding to the reference pixel 705. In this example, the light shielding film 303 is formed at the upper-left position. A positional relation of the light shielding film 303 satisfies the formula (4). Therefore, also in the present embodiment, the infrared rays for entering the reference pixel 705 from outside are shielded by the light shielding film 303.

Next, a circuit operation of the detector 700 illustrated in FIG. 9 will be described. First, a driving voltage $V_{dd}$ is applied to a drive voltage terminal 710 by a driving circuit (not shown). Subsequently, when the clamp controlling signal is input to the clamp controlling signal line 722 and the clamp controller 721 is turned on, the driving voltage $V_{dd}$ is applied to the anode side of the pn junction diode 706 in the reference pixel 705.

On the other hand, the load transistor 711 connected to the cathode side of the pn junction diode 706 in the reference pixel 705 is used as the constant current source. A predetermined gate voltage $V_g$ is applied to a gate electrode of the load transistor 711 via a power supply line 712, and a drain current $I_f$ determined according to the gate voltage $V_g$ is supplied to the pn junction diode 706 in the reference pixel 705.

When it is assumed that the voltage drop of the pn junction diode 706 at this time is $V_{f0}$, a voltage on the cathode side of the pn junction diode 706 is $V_{dd}-V_{f0}$. Since the cathode side of the pn junction diode 706 is connected to the non-inverting input terminal of the difference amplifier 724 included in the buffer 723, a voltage of the output terminal of the difference amplifier 724 is also $V_{dd}-V_{f0}$.

Also, the clamp switch 725 connected to each vertical signal line 703 is concurrently turned on by inputting the clamp controlling signal to the clamp controlling signal line 722. As a result, the voltage of each vertical signal line 703 is also $V_{dd}-V_{f0}$. This voltage is the voltage of one of the electrodes of a coupling capacity 715.

On the other hand, in a double correlated sampling circuit 714, the reference row is selected, and at the same time, the clamp switch 718 is turned on. The double correlated sampling circuit 714 becomes a voltage follower circuit. That is, an inverting input terminal, a non-inverting input terminal, and an output terminal of a difference amplifier 716 have the voltage $V_{CL}$ which is the same as that of the non-inverting input terminal. Therefore, a voltage difference of $V_{CL}-(V_{dd}-V_{f0})$ is generated at both ends of the coupling capacity 715.

After that, the clamp switch 718 is turned off, and the voltage difference is held by the coupling capacity 715.

When the clamp controller 721 is turned off, the drive of the reference pixel 705 is terminated. Then, the vertical signal line 703 returns to almost zero voltage. Accordingly, the voltage of the inverting input terminal of the difference amplifier 716 is $V_{CL}-(V_{dd}-V_{f0})$, and the voltage of the vertical signal line 703 at the time of driving the reference pixel 705 is clamped to the voltage of the non-inverting input terminal. The above processing is referred to as a clamp step B.

Subsequently, the procedure proceeds to the drive of the heat-sensitive row. When a row selector 707 corresponding to the first heat-sensitive row (first heat-sensitive row) is turned on, the driving voltage $V_{dd}$ of the drive voltage terminal 710 is applied to a horizontal signal line 702 (first row selecting line) connected to the heat-sensitive pixel 704, and all the heat-sensitive pixels 704 connected to the heat-sensitive row are driven.

A driving method is similar to that of the reference pixel 705. A drain current $I_f$ of the load transistor 711 (second load transistor) is supplied to the pn junction diode 706, and a voltage drop $(V_{f1})$ according to the drain current $I_f$ is generated in the pn junction diode 706. Accordingly, the voltage of the vertical signal line 704 is $V_{dd}-V_{f1}$.

As a result, the voltage of the inverting input terminal of the difference amplifier 716 is $V_{CL}+V_{f0}-V_{f1}$. A difference $V_{f0}-V_{f1}$ between the voltage $V_{CL}+V_{f0}-V_{f1}$ of the inverting input terminal and the voltage $V_{CL}$ of the non-inverting input terminal is amplified and output from the output terminal of the difference amplifier 716. That is, a difference between a forward voltage $V_{f0}$ of the pn junction diode 706 in the reference pixel 705 and a forward voltage $V_{f1}$ of the pn junction diode 706 in the heat-sensitive pixel 704 is amplified.

The difference amplifier 716 amplifies a contributed amount (infrared signal) of the heat generation caused by absorbing the infrared rays emitted from outside similarly to a case of the detector 600 in FIG. 8 and outputs it. The above process is completely similar to the imaging step of the detector 600.

Subsequently, the clamp step B is performed again. That is, the reference pixel 705 is driven by inputting the row selecting signal to the clamp controlling signal line 722, and a clamp operation of the double correlated sampling circuit 714 is performed.

At this time, the voltage $V_{f0}$ which drops in the pn junction diode 706 in the reference pixel 705 is different from that of the last clamp step under the influence of flicker noise because there is a time difference with the last clamp step. Therefore, the voltage difference held by the coupling capacity 715 is different from the voltage at the last clamp step.

Next, the row selector 707 corresponding to a heat-sensitive row (second heat-sensitive row) following the heat-sensitive row driven at the last time is turned on, and the heat-sensitive pixel 704 connected to the horizontal signal line 702 (second row selecting line) corresponding to the row selector 707 is driven. The amplified infrared signal is output from the double correlated sampling circuit 714 based on a voltage difference newly held by the coupling capacity 715. After that, similarly, the clamp step B and the imaging step are alternately performed, and infrared information from all the pixels can be finally obtained.

In the circuit of the detector 600 in FIG. 8 according to the first embodiment, the voltage of the horizontal signal line 602 clamped at the time of driving the reference pixel 605 is used as a fixed voltage for a single frame. Therefore, the flicker noise of the heat-sensitive pixel 604 is superimposed to the output of the difference amplifier 616.

Also, since the flicker noise is generated in the reference pixel 605, the voltage to be clamped changes for each frame. As a result, random vertical stripe noises are generated in an image. This noise deteriorates the image quality and may be a factor to decrease a temperature resolution as the infrared sensor.

On the other hand, since the circuit of the detector 700 according to the present embodiment performs the clamp operation for each row, the clamp operation based on the voltage which is different for each row is performed. Therefore, the generation of the random vertical stripe noise as in the circuit in FIG. 8 can be avoided. Therefore, a noise in the output image can be reduced, and the temperature resolution of the infrared sensor can be improved.

In addition, in the detector 700 according to the present embodiment, the single reference pixel 705 is used to clamp. Therefore, the position of the reference pixel 705 can be easily secured, and the degree of freedom in design can be improved.

Also, compared with a case where the reference pixel 605 is provided for each row as the circuit as in FIG. 8, the influence caused by a variation of the reference pixels can be removed. Therefore, an output difference between the rows can be reduced.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. An infrared sensor comprising:
   a housing having a bottom surface and side surfaces;
   a detector mounted on the bottom surface of the housing including:
      a heat-sensitive pixel region having a plurality of heat-sensitive pixels of which an output voltage changes when infrared rays are received; and
      a reference pixel region having at least one reference pixel of which output voltage changes are smaller than those of the heat-sensitive pixel while receiving the infrared rays;
   a lid sealing the housing including:
      a support member which is bonded to the side surfaces of the housing and has an opening positioned above the heat-sensitive pixel region, the support member surrounding the opening not transmitting infrared rays; and
      a window member which covers the opening at a position nearer to the sensor device than the support member and is bonded to a surface of the support member in a surrounding area of the opening, the window member transmitting infrared rays; and
   a light shielding film arranged on a surface of the detector on a side of the window member and arranged to oppose to the reference pixel region so that the infrared rays entering the reference pixel region are shielded.

2. The infrared sensor according to claim 1, wherein an end of the light shielding film on a side of the heat-sensitive pixel region is closer to the heat-sensitive pixel region than an end of the reference pixel region on a side of the heat-sensitive pixel region.

3. The infrared sensor according to claim 2, wherein the end of the light shielding film on the side of the heat-sensitive pixel region is positioned closer to the heat-sensitive pixel region than an intersection between an optical path of infrared rays entering the end of the reference pixel region on the side of the heat-sensitive pixel region and the surface of the detector on the side of the window member.

4. The infrared sensor according to claim 2, wherein the end of the light shielding film on the side of the heat-sensitive pixel region is positioned closer to the reference pixel region than an optical path of infrared rays entering the heat-sensitive pixel region.

5. The infrared sensor according to claim 1, wherein an end of the reference pixel region opposite to the heat-sensitive pixel region is positioned closer to the heat-sensitive pixel region than an end of the light shielding film opposite to the heat-sensitive pixel region.

6. The infrared sensor according to claim 1, wherein the housing is vacuum-sealed with the lid.

7. The infrared sensor according to claim 1, comprising:
   a selector configured to select the pixel to be used based on a signal from the pixel, the signal including the output voltage of the heat-sensitive pixel and the output voltage of the reference pixel.

8. The infrared sensor according to claim 7, wherein the selector selects the pixel to be used as a reference pixel from among the pixels arranged on the reference pixel region based on the signal from the pixel arranged on the reference pixel region.

9. The infrared sensor according to claim 7, wherein the selector selects the pixel to be used as a heat-sensitive pixel from among the pixels arranged on the heat-sensitive pixel region based on the signal from the pixel arranged on the heat-sensitive pixel region.

10. The infrared sensor according to claim 1, wherein the detector includes at least the reference pixel region, the heat-sensitive pixel region, and a load transistor which supplies a constant current to the reference pixel included in the reference pixel region and the heat-sensitive pixel included in the heat-sensitive pixel region, and
    the load transistor is formed between the reference pixel region and the heat-sensitive pixel region.

11. The infrared sensor according to claim 1, wherein the detector includes:
    a reference pixel selecting line which is connected to the reference pixel and applies a driving voltage to the reference pixel;
    a first load transistor which is connected to the reference pixel and supplies a constant current;
    a first row selecting line which is connected to the heat-sensitive pixel included in a first heat-sensitive row including the plurality of heat-sensitive pixels and applies the driving voltage to the heat-sensitive pixels included in the first heat-sensitive row;
    a second row selecting line which is provided along the first heat-sensitive row, connected to the heat-sensitive pixel included in a second heat-sensitive row including the plurality of heat-sensitive pixels, and applies the driving voltage to the heat-sensitive pixel included in the second heat-sensitive row;
    a vertical signal line which is connected both the heat-sensitive pixel included in the first heat-sensitive row and the heat-sensitive pixel included in the second heat-sensitive row, a second load transistor which is connected to one end of the vertical signal line and supplies the constant current;

a reference pixel selector which connects the first load transistor to the vertical signal line;

a driving circuit which selects the first row selecting line after selecting the reference pixel selecting line, further selects the second row selecting line after selecting the reference pixel, and applies the driving voltages at the time of each selection; and a double correlated sampling circuit which temporarily holds a first voltage of the vertical signal line at the time of selecting the reference pixel selecting line and subsequently amplifies and outputs a difference between a second voltage of the vertical signal line at the time of selecting the first row selecting line or the second row selecting line and the first voltage.

* * * * *